(12) United States Patent
Marx et al.

(10) Patent No.: US 6,261,382 B1
(45) Date of Patent: Jul. 17, 2001

(54) WAFER MARKING

(75) Inventors: Eckhard Marx, Radeburg; Detlef Gerhard, München; Steffen Franke, Dresden, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/495,795

(22) Filed: Feb. 1, 2000

Related U.S. Application Data

(63) Continuation of application No. PCT/DE98/02187, filed on Jul. 3, 1998.

(30) Foreign Application Priority Data

Aug. 1, 1997 (DE) .............................................. 197 33 410

(51) Int. Cl.$^7$ ................................................. H01L 29/30
(52) U.S. Cl. .................... 148/33.2; 438/401; 438/798
(58) Field of Search .................... 148/33, 33.2; 438/308, 438/401, 798

(56) References Cited

U.S. PATENT DOCUMENTS

| | | | |
|---|---|---|---|
| 4,597,166 | * 7/1986 | Iwai | 148/33.2 |
| 5,475,268 | 12/1995 | Kawagoe et al. | 257/797 |
| 5,786,267 | * 7/1998 | Haraguchi et al. | 148/33.2 |
| 5,877,064 | * 3/1999 | Chang et al. | 438/401 |

FOREIGN PATENT DOCUMENTS

3324551A1   1/1985  (DE) .

OTHER PUBLICATIONS

Japanese Patent Abstract No. 02224218 (Matsuo), dated Sep. 6, 1990.

"A close look at laser marking of silicon wafer", Jim Scaroni et al., Solid State Technology, 1997, pp. 245–251.

\* cited by examiner

Primary Examiner—Chandra Chaudhari
(74) Attorney, Agent, or Firm—Herbert L. Lerner; Laurence A. Greenberg; Werner H. Stemer

(57) ABSTRACT

A wafer marking is disclosed, which is represented by a large number of soft marks incorporated into a surface of a wafer. The soft marks each have a depth of at least 4 $\mu$m, an internal diameter of at least 50 $\mu$m and, in a particularly advantageous manner, a minimum gradient their surface of 0.2. These depressions can be proded, using appropriate technology, with depths of up to $\mu$m.

4 Claims, 1 Drawing Sheet

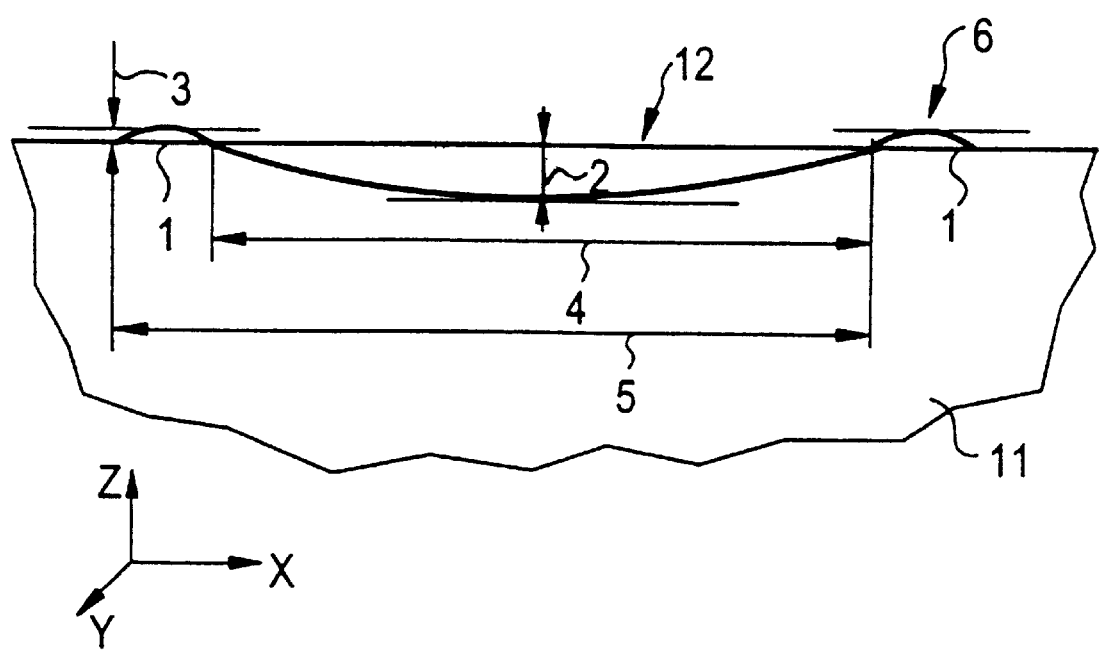

WAFER MARKING

CROSS-REFERENCE TO RELATED APPLICATION

This is a continuation of copending International Application PCT/DE98/02187, filed Jul. 30, 1998, which designated the United States.

BACKGROUND OF THE INVENTION

FIELD OF THE INVENTION

The invention relates to a wafer marking which is used in the manufacture of semiconductors. A wafer or an entire batch of wafers can be identified from the marking or inscription. The coding contained in the inscription provides information about the various manufacturing and product data items, so that identification and assignment are possible at any time.

Various types of process steps are carried out on a wafer during the processing in order to produce semiconductor components, in which surface layers are removed both from the underneath and from the top. If, for example, bar codings are applied as markings, for example by a laser on the surface of a wafer, then the laser produces small depressions, points or so-called dots which produce bar codings, for example disposed in a row. These can be read by special readers for bar codings. However, the markings are subjected to all the process steps during manufacture.

Owing to the increasing number of processes and the use of so-called chemical mechanical processes (CMP), for example chemical and mechanical polishing on the front of the wafer, any inscription/marking applied to the front of the wafer is increasingly affected by the application and removal of layers. In the end, this can lead to the inscription being completely erased.

Previous markings or inscriptions on wafers are, for example, so-called hard marks, which are made very deeply on the rear of the wafer. However, such inscriptions are completely destroyed after the rear has been polished. Further disadvantages of hard marks are that the laser inscription process injects so much energy into the wafer that spattering occurs on the wafer surface. In the laser inscription process, the silicon is not melted, but it vaporizes at the processing point or at the laser impact point. As a rule, hard marks are burnt very deeply into the material. Such a depression (dot) is between 5 $\mu$m and 100 $\mu$m deep. Owing to the relatively large amount of energy injected, such dots are also irregular, and in some cases have sharp edges or peaks.

In addition to hard marks, it is known for so-called soft marks to be used for the marking of wafers. This can be done using the latest laser technology. The laser light is in this case injected into the wafer such that only the material at the surface is essentially melted. The inscription contains a plurality of dots produced by the laser. The result is a homogeneous inscription, free of any dirt. The depth of a normal soft mark is generally between 0.5 $\mu$m and 1 $\mu$m.

SUMMARY OF THE INVENTION

It is accordingly an object of the invention to provide a wafer marking that overcomes the above-mentioned disadvantages of the prior art devices of this general.

With the foregoing and other objects in view there is provided, in accordance with the invention, a wafer marking, including:

a plurality of depressions formed systematically into a wafer surface of a wafer and each having a circumferential rim and an outline selected from the group consisting of round outlines and elliptical outlines, the plurality of depressions in each case starting from the wafer surface have a depth of at least 4 $\mu$m and a rim height of a maximum of 1.5 $\mu$m, the plurality of depressions further having an internal diameter measured between intersections of the wafer surface and a surface of a depression being greater than 50 $\mu$m, and an overwhelming majority of the plurality of depressions having a gradient of not more than 0.2.

The invention is based on the object of providing a wafer marking containing a large number of depressions incorporated systematically into the wafer surface of a wafer which, together with their rim, form a very largely smooth surface.

The invention is based on the knowledge that the depth of the markings required for laser dots can be provided with a gradient at the rim and in the dot itself which is as minimal as possible. This results in a varnish coating being given maximum reliability, so that the probability of varnish cracks is greatly reduced. This is justified by the fact that there are neither any notches nor sharp edges in the dot, but around the dot.

A gradient in the lateral direction (dz/dx or dz/dy) of not more than 0.2 has been found to be particularly advantageous. The intersections at the cut in the dot surface with the original wafer surface and the minimum of each dot are in this case used as corner points. The intersection of the wafer surface with the inner surface of the raised rim of each dot is regarded as the internal diameter of a depression, or of a dot. The external diameter of a dot may be in a relatively wide range, from 60 to 120 $\mu$m. The depressions in the surface of a wafer can be produced by a laser beam which, with appropriate technology, ensures that no spattering whatsoever is produced by vaporizing material, with a depression being produced instead which is formed purely by melting of the material at the surface. Such a depression has a noticeable but relatively shallow depth with regard to the original wafer surface and is surrounded by a raised rim. This is produced by a focused laser beam.

Other features which are considered as characteristic for the invention are set forth in the appended claims.

Although the invention is illustrated and described herein as embodied in a wafer marking, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a diagrammatic, fragmented, sectional view of a wafer according to the invention.

DESCRIPTION OF THE PREFERRED EMBODIMENTS

Since marking a rear of a wafer involves major disadvantages, for various reasons, front marking of the wafer is preferred, and will be described. In this case, a primary factor is essentially the avoidance of material spattering when the depressions or dots are formed. A depression with a minimum depth of 4 μm and a maximum rim height of 1.5 μm satisfies these conditions. This is due to the fact that, based on this, the depression or the dot has a diameter of more than 50 μm. The dot is produced by laser radiation such that only the surface of the material is melted. No material spattering whatsoever thus occurs, with only the material at the surface being melted, forming a depression and a raised rim. The dots that are produced may be regarded as soft marks, although these are deeper than in the past. Subsequent processes, which are linked to the application of a varnish, are improved in that the probability of varnish cracking is reduced. This is due to the fact that there are no notches or sharp edges whatsoever. Specifically, varnish cracking linked to the ingress of chemical substances under the varnish would lead to a greatly increased scrap rate.

Referring now to the single FIGURE of the drawing in detail, there is shown a shape of a dot 12 that is thus defined by a rim height 3 of less than 1.5 μm, by a maximum dot depth 2 of more than 4 μm, and by a redundant internal diameter 4 of more than 50 μm. An external diameter 5 of approximately 60 to 120 μm together with what has been stated above results in a dot shape on a wafer 11 which results in the dot 12 which is incorporated into a wafer surface 1. The dot shape withstands a large number of wafer processing steps involving material removal and allows the marking represented by the dots 12 to be read regularly. In this case, it is particularly advantageous if a gradient at the surface within the dots 12 and at a rim 6 is considerably less than 0.2.

This results in a homogeneous marking or inscription, which contains the dots 12 disposed in a row and produced by a laser.

We claim:

1. A wafer marking, comprising:

a plurality of depressions formed systematically into a wafer surface of a wafer and each having a circumferential rim and an outline selected from the group consisting of round outlines and elliptical outlines, said plurality of depressions in each case starting from the wafer surface have a depth of at least 4 μm and a rim height of a maximum of 1.5 μm, said plurality of depressions further having an internal diameter measured between intersections of the wafer surface and a surface of a depression being greater than 50 μm, and an overwhelming majority of said plurality of depressions having a gradient of not more than 0.2.

2. The wafer marking according to claim 1, wherein said gradient has a magnitude and the magnitude of said gradient on a surface inside of said depression and on said circumferential rim is less than 0.2.

3. The wafer marking according to claim 1, wherein each of said plurality of depressions have an external diameter in a range from 60 to 120 μm.

4. The wafer marking according to claim 1, wherein said plurality of depressions are formed by a focused laser beam.

* * * * *